(12) United States Patent
Takizawa et al.

(10) Patent No.: US 8,243,539 B2
(45) Date of Patent: Aug. 14, 2012

(54) NONVOLATILE SEMICONDUCTOR MEMORY DEVICE

(75) Inventors: Makoto Takizawa, Kanagawa-ken (JP); Shoichi Ozaki, Kanagawa-ken (JP); Katsumi Abe, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 268 days.

(21) Appl. No.: 12/782,159

(22) Filed: May 18, 2010

(65) Prior Publication Data
US 2010/0296342 A1    Nov. 25, 2010

(30) Foreign Application Priority Data

May 21, 2009  (JP) .................................. 2009-123281

(51) Int. Cl.
*G11C 7/00* (2006.01)

(52) U.S. Cl. ....................................... 365/201; 365/200

(58) Field of Classification Search .................. 365/201, 365/200
See application file for complete search history.

(56) References Cited

U.S. PATENT DOCUMENTS
6,388,927 B1 *  5/2002  Churchill et al. ............. 365/201

FOREIGN PATENT DOCUMENTS
JP    3967583    6/2007

* cited by examiner

*Primary Examiner* — Son Dinh
*Assistant Examiner* — Nam Nguyen
(74) *Attorney, Agent, or Firm* — Oblon, Spivak, McClelland, Maier & Neustadt, L.L.P.

(57) ABSTRACT

When bit lines or sense amplifiers are checked whether they are defective during a test performed to check whether the bit lines are defectively open, an electrical current supplied from one sense amplifier is detected by another sense amplifier. Thus, if plural bit lines are defectively open, they can be detected simultaneously. Consequently, the test time can be shortened greatly.

5 Claims, 6 Drawing Sheets

NONVOLATILE SEMICONDUCTOR MEMORY DEVICE

CROSS-REFERENCE TO RELATED APPLICATION

This application is based upon and claims the benefit of priority from the prior Japanese Patent Application No. 2009-123281, filed on May 21, 2009, the entire contents of which are incorporated herein by reference.

BACKGROUND OF THE INVENTION

The present invention relates to a nonvolatile semiconductor memory device and, more particularly, to a test circuit used to facilitate testing performed during manufacturing of the device. This test circuit is used for electrically erasable, nonvolatile semiconductor memory devices required to be detected whether or not there are faults (e.g., whether their bit lines are defectively open).

DESCRIPTION OF THE RELATED ART

An EEPROM that is electrically erasable PROM is one known type of semiconductor memory device. Among EEPROM devices, NAND cell type EEPROMs consisting of plural memory cells connected in series to form NAND cells have attracted attention because they allow for a larger scale of integration. NAND cells having one word line or select gate line shared are treated as one cell block. Usually, operations including read operation and write operation are carried out by selecting one out of plural blocks and performing such an operation on the selected block. NAND cell type EEPROMs are often fabricated as a NAND flash memory configuration in which memory cells in any desired block can be erased in a batch.

A bit line fault check for detecting whether or not bit lines have faults is carried out as one test item performed using a memory tester when the wafers of NAND flash memories are tested. This test item cannot be omitted in the test because any bit line detected to be defective is replaced by a column redundancy circuit.

Items of the bit line fault check include open check, short check, and short check between adjacent sense amplifiers.

Conventionally, when bit lines are checked for faults, it is necessary to access word lines in turn from WL [0] in order to detect which of the multiple bit lines are at fault. It takes a long time to perform this operation. Furthermore, where there are plural memory areas, it is essential to access each individual memory area separately in detecting bit line faults. This increases the testing time (see Patent Document 1). Where the wafer of the conventional NAND flash memories is tested to check their bit lines for faults, if there are plural memory areas, it has been required to access each individual memory area separately in detecting bit line faults as mentioned previously. This presents the problem that the testing time is prolonged.

The present invention has been made to solve the foregoing problem. It is an object of the invention to provide a nonvolatile semiconductor memory device which, when the wafer of semiconductor memories is tested and bit lines are checked for faults, permits plural bit line defects to be detected, thus greatly shortening the test time.
[Patent Document]
[Patent Document 1] Japanese Patent Kokai2003-178599

BRIEF SUMMARY OF THE INVENTION

A first nonvolatile semiconductor memory device of the present invention includes: a memory cell array having bit lines with which memory cells are connected; sense amplifiers connected with respective one ends of the bit lines and performing sense amplifications of potentials on the bit lines; and bit line driver transistors which are connected with the bit lines and which are turned on when the bit lines are checked to enable the plural bit lines. An electrical current supplied from a first one of the sense amplifiers enabled when the bit line driver transistors are turned on is detected by a second one of the sense amplifiers.

According to the nonvolatile semiconductor memory device as described above, when the bit lines or sense amplifiers are checked for faults in a case where the bit lines are checked whether or not they are defectively open, plural bit line open faults are detected at the same time, thus greatly shortening the test time.

DETAILED DESCRIPTION OF THE INVENTION

Embodiments of the present invention are hereinafter described in detail with reference to the drawings.

First Embodiment

Figure 1:
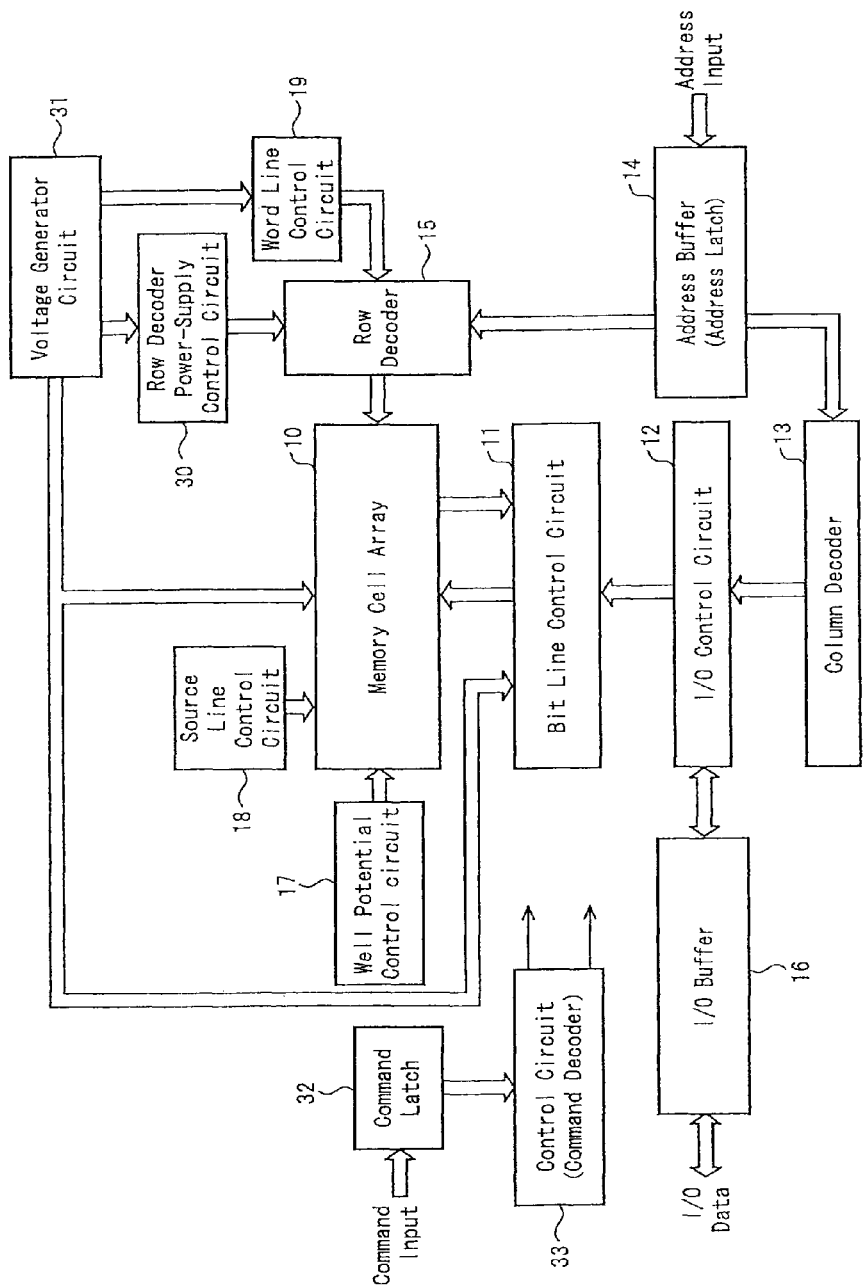
FIG. 1 is a block diagram schematically showing the whole structure of a NAND flash memory device associated with a first embodiment of the present invention.

FIG. 1 is a block diagram schematically showing the whole structure of a NAND flash memory device associated with a first embodiment of the present invention. The memory device includes a memory cell array 10 and a bit line control circuit 11 for reading data from the array 10, writing data into the array 10, rewriting data into the array 10, and performing write verify reading and erase verify reading.

The bit line control circuit 11 consists principally of CMOS flip-flops, and includes sense amplifiers for performing sense amplifications of the potentials on bit lines and latch circuits acting as data latch circuits for latching data to be written. The control circuit 11 also performs a sensing operation for verify reading after writing, latching of rewritten data, and transfer of data (such as written data and readout data) to and from a data input-output control circuit 12.

The data input-output control circuit 12 controls inputting from the outside and outputting from the inside (such as of written data and readout data), and is connected with a data input-output buffer (I/O buffer) 16 and with the bit line control circuit 11.

Connection of the data input-output control circuit 12 is controlled by the output from a column decoder 13 that receives an address signal from an address buffer (address latch) 14 receiving an address input.

The memory device further includes a row decoder 15 to control the control gates and select gates of the memory cell array 10. A well potential control circuit 17 is provided to control potentials in p-type wells (or a p-type substrate) forming the memory cell array 10. A source line control circuit 18 is provided to control the cell source line voltage within the cell array.

In addition, the memory device includes a word line control circuit 19 for controlling the potential on each word line (control gate line) within a selected block. Moreover, the memory cell includes a row decoder power-supply control circuit 30 for controlling the potential at a row decoder power supply.

Additionally, the memory device has a voltage generator circuit 31 for producing various voltages (such as a high voltage for writing, intermediate voltages, a high voltage for erasure, and a high voltage for readout). During erase operation, the voltages are applied to the p-type wells (or p-type substrate). During write operation, the voltages are supplied to the word lines, bit lines, row decoder power supply, and so on.

Further, the memory device includes a command latch 32 for latching commands entered from the outside and a control circuit (command decoder) 33 for outputting control signals for controlling operations for reading data from the memory cell array, writing data into the cell array, and erasing the cell array in accordance with the commands latched in the command latch 32.

Figure 2:
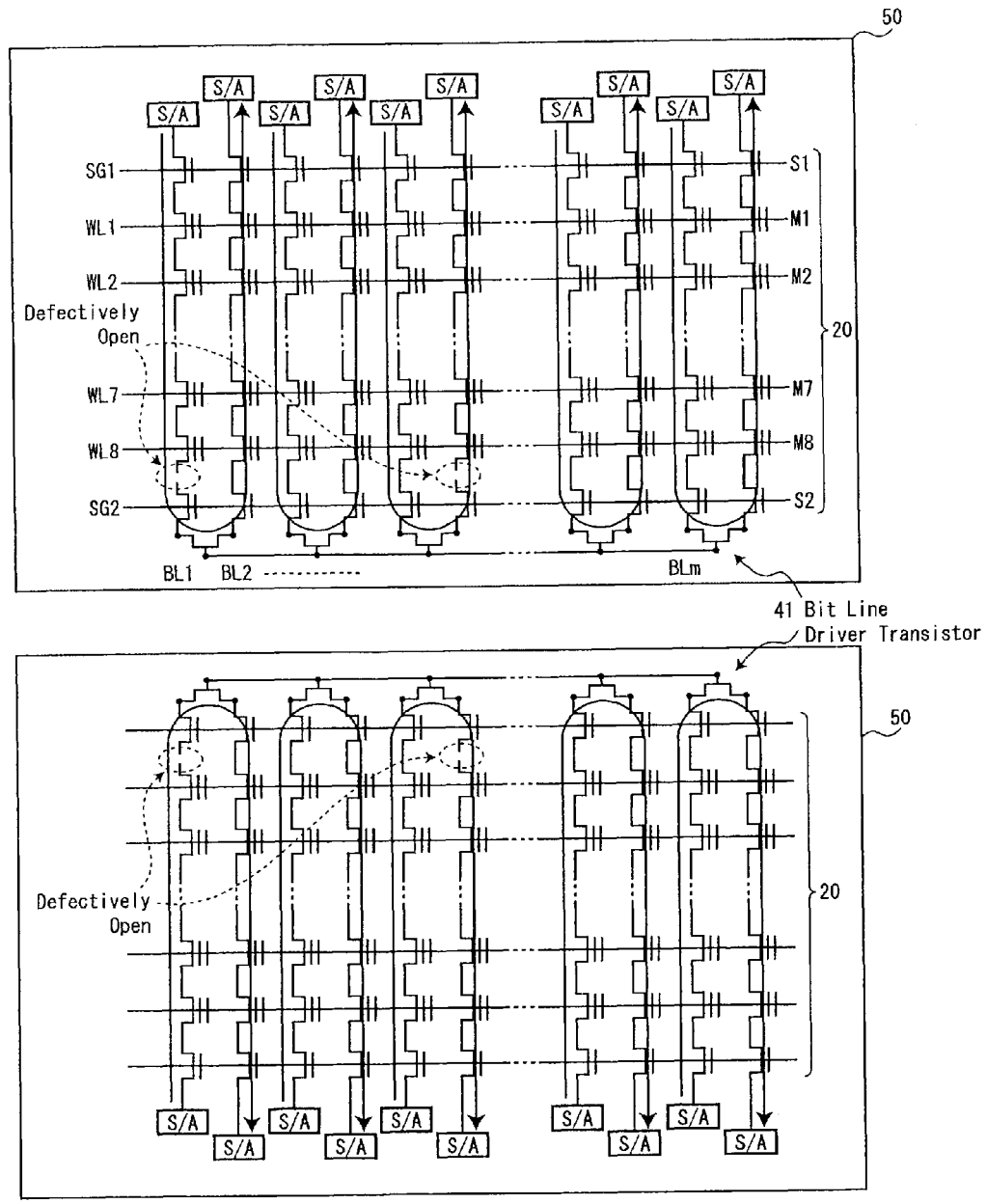
FIG. 2 schematically depicts the manner in which bit lines are checked whether or not they are open, using some of the bit lines, bit line driver transistors, and sense amplifiers in one cell block of the NAND flash memory device.

FIG. 2 schematically depicts the manner in which bit lines are checked whether or not they are open, using some of the bit lines, bit line driver transistors, and sense amplifiers in one cell block of the NAND flash memory device.

NAND cells 20 are made of plural memory cells (8 memory cells M1-M8 in the present example) which are connected in series such that adjacent ones share a source and a drain. Select gate transistors S1 and S2 are connected with the drain and source of each memory cell. The memory cells M1-M8 have a MOSFET configuration including a semiconductor substrate on which floating gates are formed via a gate insulator film. Control gates are stacked over the floating gates via an interlayer dielectric film. The select gate transistors S1 and S2 also have a MOSFET configuration. Bit lines are disposed over the substrate via a CVD oxide film in this way, the substrate having device elements formed thereon. Each of the bits lines is connected with one end of the select gate transistor S1, while the other end is connected with a sense amplifier 40. One end of the transistor S2 is connected with a bit line driver transistor 41. In the memory cell array 10 of FIG. 1, NAND cells 20 of the structure described above are arranged in a matrix of rows and columns. In this configuration, select gate transistors S1 on the drain side of the NAND cells are commonly connected with the bit lines. The select gate transistors S2 on the source side are connected with a common source line (cell source line voltage).

The control gates of the memory cells M1-M8 are disposed as control gate lines (word lines) WL1, WL2, . . . , WL8 in the direction of rows of the memory cell array. The gate electrodes of the select gate transistors S1 and S2 are disposed as select gate lines SG1 and SG2 in the direction of rows of the memory cell array.

Figure 3:
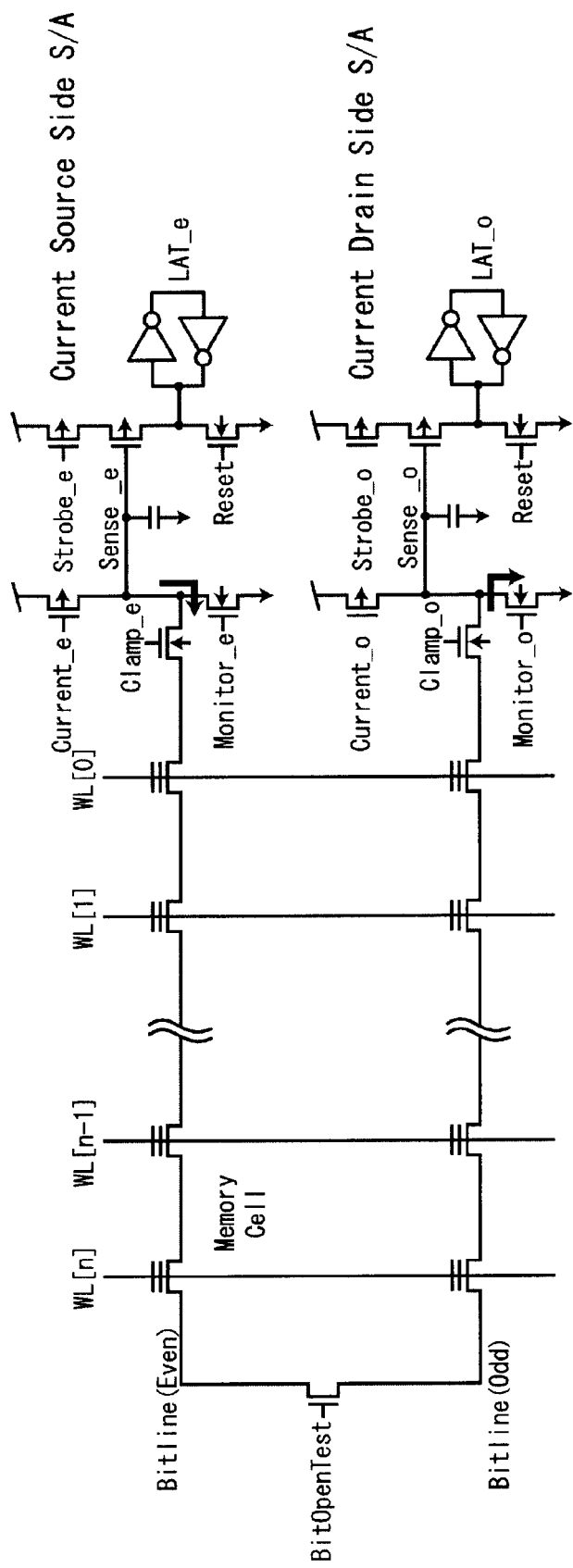
FIG. 3 is a block diagram schematically showing the connective relationships among the NAND flash memories of FIG. 1, bit lines, and bit line driver transistors.
Figure 4:
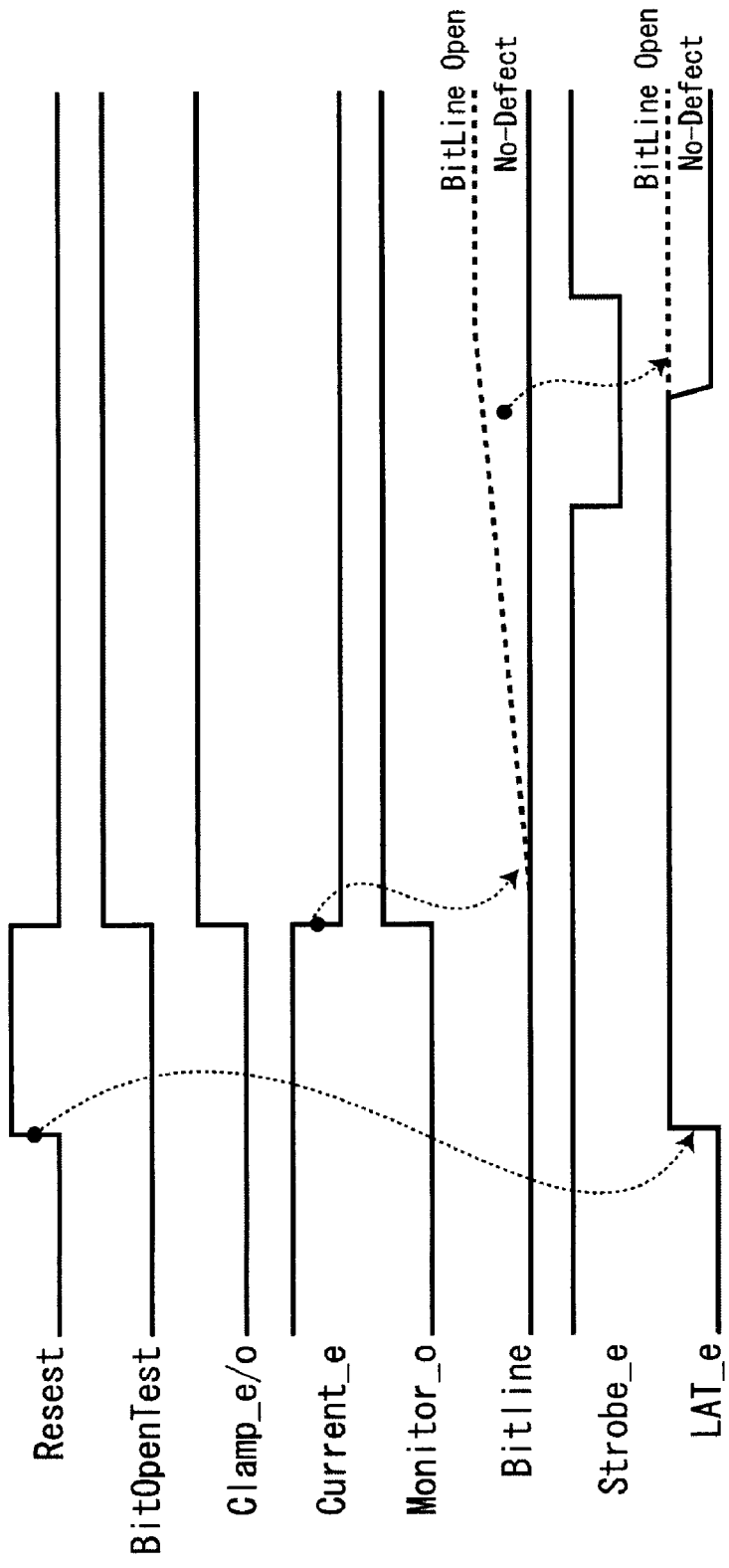
FIG. 4 schematically depicts the timings of operations carried out to perform the bit line fault test to check whether bit lines are open, using the sense amplifiers, bit lines, and bit line driver transistors of the NAND flash memory device of FIG. 3.

A bit line fault test performed to check whether or not bit lines are open is next described briefly with reference to FIGS. 3 and 4. FIG. 3 is a block diagram schematically showing the connective relationships among the NAND flash memories of FIG. 1, bit lines, and bit line driver transistors. FIG. 4 schematically depicts the timings of operations carried out to perform the bit line fault test to check whether bit lines are open, using the sense amplifiers, bit lines, and bit line driver transistors of the NAND flash memory device of FIG. 3.

In order to detect bit line faults (i.e., bit lines are defectively open), the following operations are performed. 1) A reset signal is applied to two adjacent sense amplifiers 40, and a signal "LAT_e" is set to level 1. 2) A signal "BitOpenTest" is applied to turn on the bit line driver transistors 41. 3) A signal "Clamp_e" and a signal "Clamp_o" are applied to turn on the two sense amplifiers. 4) A signal "Current_e" is applied to apply an electrical current to the bit lines from the sense amplifier on the current source side. 5) A signal "Monitor_o" is applied to draw an electrical current from the sense amplifier on the current drain side. 6) A signal "Strobe_e" is applied to detect the level of the signal "Sense_e" on the sense amplifier on the current source side. At this time, unless the bit lines are open, the sense amplifier on the current drain side draws an electrical current and so the bit lines are not charged. The signal "Sense_e" and signal "LAT_e" through the sense amplifier on the current source side assume 0 level. On the other hand, if the bit lines are open, the sense amplifier on the current drain side draws no electrical current and, therefore, the bit lines are charged. The signal "Sense_e" and signal "LAT_e" through the sense amplifier on the current source side assume level 1. Consequently, it is possible to judge which of bit line pairs (even- and odd-numbered bit lines) are open by detecting the result of the sensing.

Second Embodiment

Figure 5:
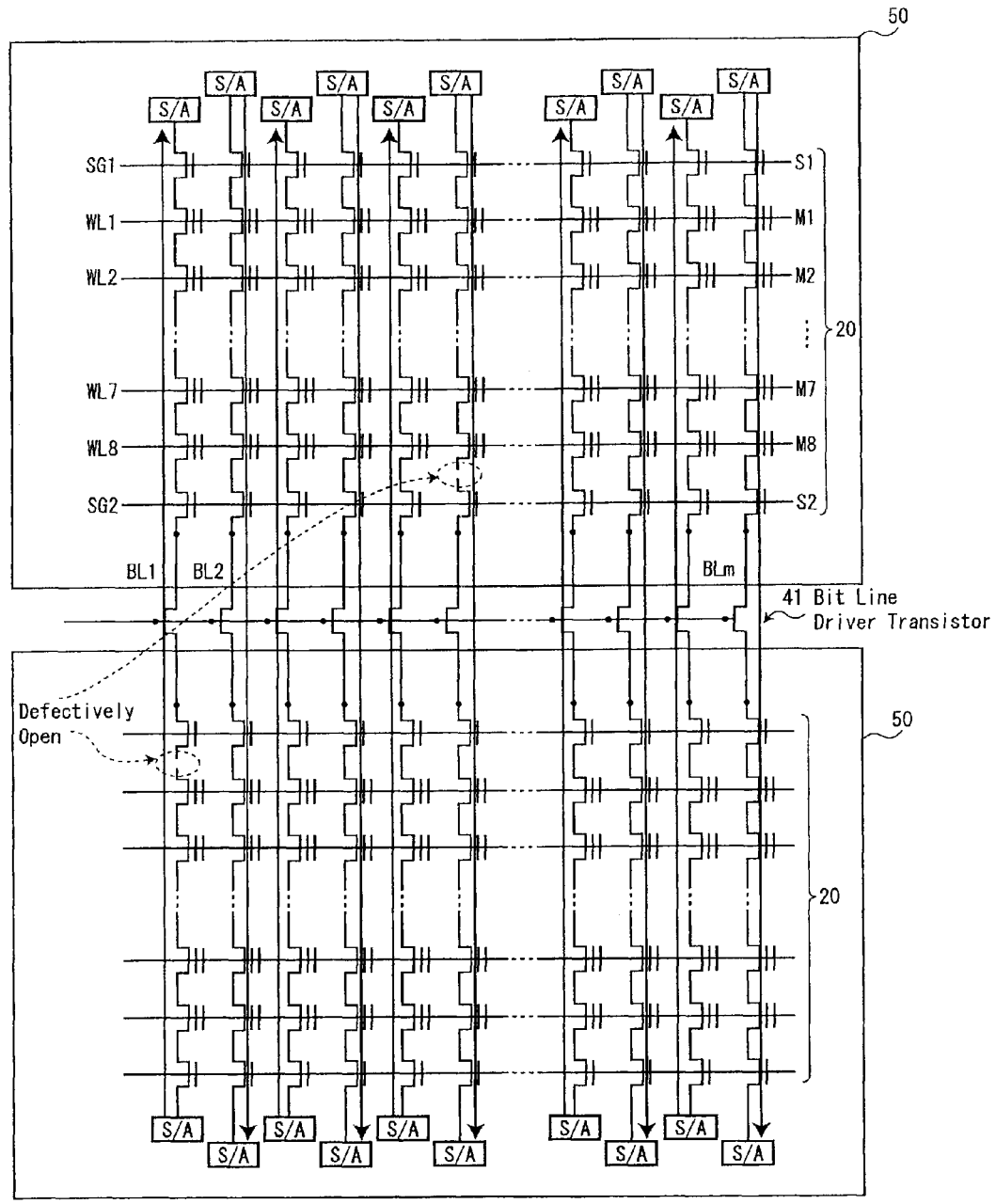
FIG. 5 conceptually illustrates a test performed to check whether or not bit lines of a NAND flash memory device associated with a second embodiment of the present invention are open.

FIG. 5 conceptually illustrates a test performed to check whether or not bit lines of a NAND flash memory device associated with a second embodiment of the present invention are open. The memory device has NAND cells 20 with which sense amplifiers 40 for holding write data or readout data are connected. There are plural memory areas 50, each of which consists of plural NAND cells 20. A bit line driver transistor 41 is connected between any two adjacent ones of the memory areas 50. The transistor 41 is controlled to be switched on and off at given timing to apply an electrical current to the bit lines in the two connected memory areas, thus precharging them. In this second embodiment, it is possible to judge which of the bit line pairs (even- and odd-numbered bit lines) are open by observing the result of a sensing operation using a fault test method similar to the method used in the first embodiment.

Third Embodiment

Figure 6:
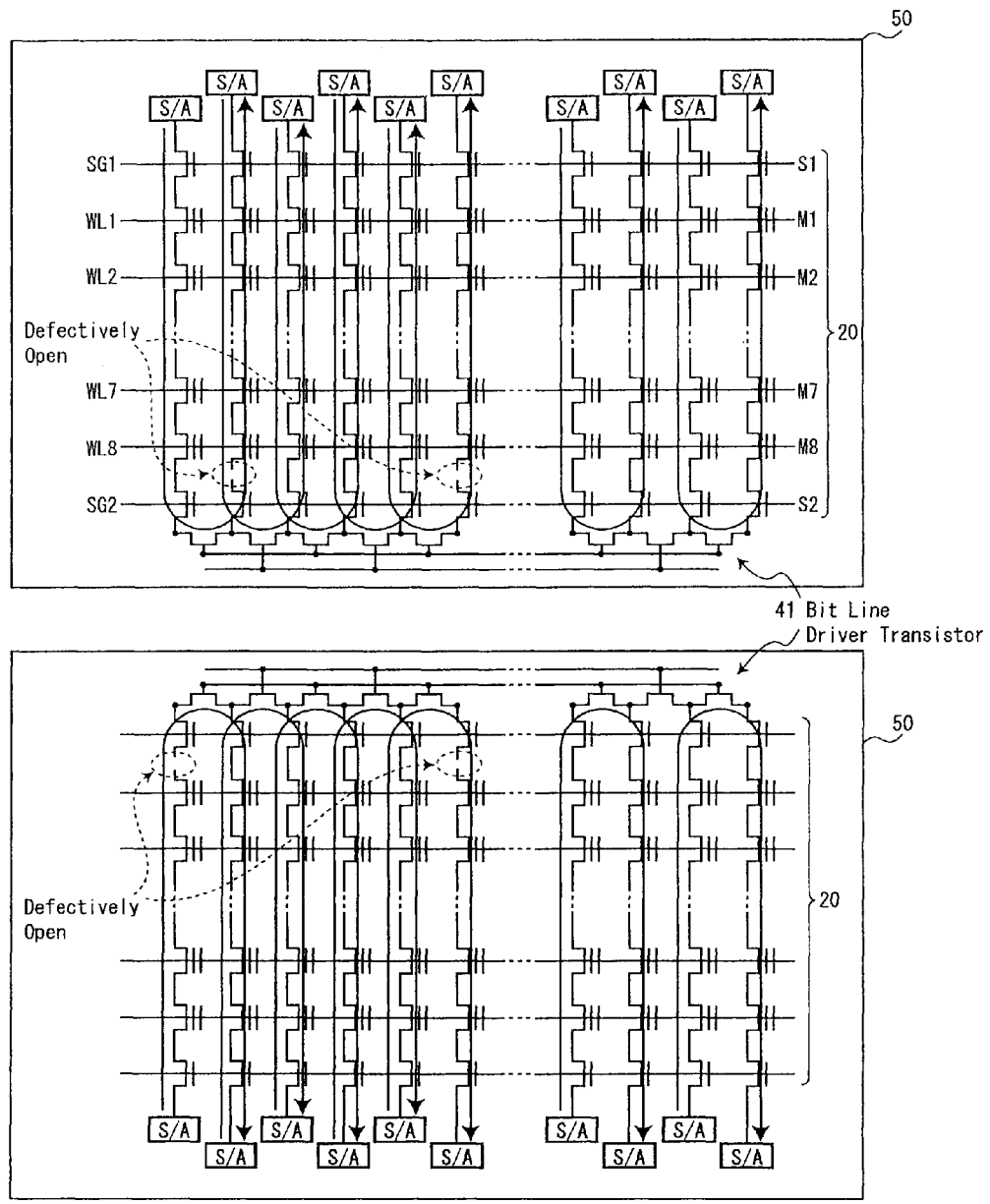
FIG. 6 conceptually illustrates a fault test performed to check whether or not bit lines of a NAND flash memory device associated with a third embodiment of the present invention are open.

FIG. 6 conceptually illustrates a fault test performed to check whether or not bit lines of a NAND flash memory device associated with a third embodiment of the present invention are open. In the first embodiment, two adjacent bit lines are checked whether they are open by enabling the bit line driver transistor between the two adjacent bit lines. With this method, it has been impossible to detect which one of the two bit lines is defectively open. In the third embodiment, it is possible to check which one of the two bits lines is open by controllably switching on and off bit line driver transistors 41 at given timing, checking whether the bit lines are open using two or more combinations, and detecting the results of the sensing operations.

As described above, in the NAND flash memory device of the present example, in a case where bit lines or sense amplifiers are checked whether they have faults during a wafer test, the test time can be greatly reduced by processing plural bit lines in parallel.

While the present invention has been described with respect to embodiments thereof, the invention is not limited thereto. Rather, the method of implementation can be modified without departing from the gist of the invention.

What is claimed is:

1. A nonvolatile semiconductor memory device comprising:
    a memory cell array having bit lines with which memory cells are connected;
    sense amplifiers connected with respective one ends of the bit lines and performing sense amplifications of potentials on the bit lines; and
    a bit line driver transistor which is connected with the bit lines and which is turned on during checking of the bit lines to thereby enable the bit lines;
    wherein an electrical current supplied from one of the sense amplifiers enabled when the bit line driver transistor is turned on is detected by another of the sense amplifiers.

2. A nonvolatile semiconductor memory device according to claim 1, wherein said bit line driver transistor is connected with respective one ends of the bits lines with which the sense amplifiers are not connected.

3. A nonvolatile semiconductor memory device according to claim 1, wherein said bit line driver transistor enables at least two bit lines selected from different memory areas.

4. A nonvolatile semiconductor memory device according to claim 1, wherein said at least one bit line driver transistors is plural in number, and wherein the bit lines are selected from two or more combinations and an operation for checking the bit lines is performed.

5. A nonvolatile semiconductor memory device according to claim 1, wherein said bit line driver transistor enables adjacent ones of the bit lines.

* * * * *